(12) United States Patent
He et al.

(10) Patent No.: US 6,788,583 B2
(45) Date of Patent: Sep. 7, 2004

(54) PRE-CHARGE METHOD FOR READING A NON-VOLATILE MEMORY CELL

(75) Inventors: Yi He, Fremont, CA (US); Edward F. Runnion, Santa Clara, CA (US); Zhizheng Liu, Sunnyvale, CA (US); Mark W. Randolph, San Jose, CA (US); Darlene G. Hamilton, San Jose, CA (US); Pauling Chen, Saratoga, CA (US); Binh Le, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 142 days.

(21) Appl. No.: 10/307,749

(22) Filed: Dec. 2, 2002

(65) Prior Publication Data

US 2004/0105312 A1 Jun. 3, 2004

(51) Int. Cl.[7] .............................................. G11C 16/06
(52) U.S. Cl. .......................... 365/185.25; 365/185.02; 365/185.21; 365/203
(58) Field of Search ...................... 365/185.25, 185.21, 365/203

(56) References Cited

U.S. PATENT DOCUMENTS

| | | | |
|---|---|---|---|
| 5,448,518 A | | 9/1995 | Jinbo |
| 5,963,494 A | * | 10/1999 | Khang .......................... 365/203 |
| 6,449,201 B1 | * | 9/2002 | Kojima ........................ 365/205 |
| 6,525,969 B1 | | 2/2003 | Kurihara et al. |
| 2001/0046150 A1 | | 11/2001 | Maayan et al. |
| 2002/0034101 A1 | | 3/2002 | Semi |
| 2002/0145915 A1 | | 10/2002 | Ogura et al. |

* cited by examiner

*Primary Examiner*—Connie C. Yoha
(74) *Attorney, Agent, or Firm*—Renner, Otto, Boisselle & Sklar

(57) ABSTRACT

A method of detecting a charge stored on a charge storage region of a first dual bit dielectric memory cell within an array of dual bit dielectric memory cells comprises grounding a first bit line that forms a source junction with a channel region of the first memory cell. A high voltage is applied to a gate of the first memory cell and to a second bit line that is the next bit line to the right of the first bit line and separated from the first bit line only by the channel region. A third bit line, that is the next bit line to the right of the second bit line, is isolated such that its potential is effected only by its junctions with the a second channel region and a third channel region on opposing sides of the third bit line. A high voltage is applied to a pre-charge bit line that is to the right of the third bit line and current flow is detected at the second bit line to determine the programmed status of a source bit of the memory cell.

19 Claims, 4 Drawing Sheets

| BIT LINE | 1 | 2 | 3 | 4 | 5 | 6 |
|---|---|---|---|---|---|---|
| SOURCE BIT LINE BL(1) | SOURCE | SOURCE | SOURCE | SOURCE | SOURCE | SOURCE |
| DRAIN BIT LINE BL(2) | HIGH | HIGH | HIGH | HIGH | HIGH | HIGH |
| BL(3) | FLOAT | FLOAT | FLOAT | FLOAT | FLOAT | FLOAT |
| BL(4) | HIGH | HIGH | FLOAT | FLOAT | FLOAT | FLOAT |
| BL(5) | — | HIGH | HIGH | HIGH | FLOAT | FLOAT |
| BL(6) | — | — | — | HIGH | FLOAT | FLOAT |
| BL(n) | — | — | — | — | HIGH | HIGH |
| BL(n+1) | — | — | — | — | — | HIGH |
| BL(n+x) | — | — | — | — | — | HIGH |

PRE-CHARGE METHOD FOR READING A NON-VOLATILE MEMORY CELL

TECHNICAL FIELD

The present invention relates generally to flash memory cell devices and more specifically, to improvements in pre-charge reading methods for reading a charge previously stored in a dual bit dielectric memory cell structure.

BACKGROUND OF THE INVENTION

Conventional floating gate flash memory types of EEPROMs (electrically erasable programmable read only memory), utilize a memory cell characterized by a vertical stack of a tunnel oxide ($SiO_2$), a polysilicon floating gate over the tunnel oxide, an interlayer dielectric over the floating gate (typically an oxide, nitride, oxide stack), and a control gate over the interlayer dielectric positioned over a crystalline silicon substrate. Within the substrate are a channel region positioned below the vertical stack and source and drain diffusions on opposing sides of the channel region.

The floating gate flash memory cell is programmed by inducing hot electron injection from the channel region to the floating gate to create a non volatile negative charge on the floating gate. Hot electron injection can be achieved by applying a drain to source bias along with a high control gate positive voltage. The gate voltage inverts the channel while the drain to source bias accelerates electrons towards the drain. The accelerated electrons gain 5.0 to 6.0 eV of kinetic energy which is more than sufficient to cross the 3.2 eV $Si-SiO_2$ energy barrier between the channel region and the tunnel oxide. While the electrons are accelerated towards the drain, those electrons which collide with the crystalline lattice are re-directed towards the $Si-SiO_2$ interface under the influence of the control gate electrical field and gain sufficient energy to cross the barrier.

Once programmed, the negative charge on the floating gate disburses across the semi conductive gate and has the effect of increasing the threshold voltage of the FET characterized by the source region, drain region, channel region, and control gate. During a "read" of the memory cell, the programmed state (e.g. negative charge stored on the gate), or the non-programmed state (e.g. neutral charge stored on the gate) of the memory cell can be detected by detecting the magnitude of the current flowing between the source and drain at a predetermined control gate voltage.

More recently dielectric memory cell structures have been developed. A conventional array of dielectric memory cells 10a–10f is shown in cross section in FIG. 1. Each dielectric memory cell is characterized by a vertical stack of an insulating tunnel layer 18, a charge trapping dielectric layer 22, an insulating top oxide layer 24, and a polysilicon control gate 20 positioned on top of a crystalline silicon substrate 15. Each polysilicon control gate 20 may be a portion of a polysilicon word line extending over all cells 10a–10f such that all of the control gates 20a–20g are electrically coupled.

Within the substrate 15 is a channel region 12 associated with each memory cell 10 that is positioned below the vertical stack. One of a plurality of bit line diffusions 26a–26g separate each channel region 12 from an adjacent channel region 12. The bit line diffusions 26 form the source region and drain region of each cell 10. This particular structure of a silicon channel region 22, tunnel oxide 12, nitride 14, top oxide 16, and polysilicon control gate 18 is often referred to as a SONOS device.

Similar to the floating gate device, the SONOS memory cell 10 is programmed by inducing hot electron injection from the channel region 12 to the charge trapping dielectric layer 22, such as silicon nitride, to create a non volatile negative charge within charge traps existing in the nitride layer 22. Again, hot electron injection can be achieved by applying a drain-to-source bias along with a high positive voltage on the control gate 20. The high voltage on the control gate 20 inverts the channel region 12 while the drain-to-source bias accelerates electrons towards the drain region. The accelerated electrons gain 5.0 to 6.0 eV of kinetic energy which is more than sufficient to cross the 3.2 eV $Si-SiO_2$ energy barrier between the channel region 12 and the tunnel oxide 18. While the electrons are accelerated towards the drain region, those electrons which collide with the crystalline lattice are re-directed towards the $Si-SiO_2$ interface under the influence of the control gate electrical field and have sufficient energy to cross the barrier. Because the nitride layer stores the injected electrons within traps and is otherwise a dielectric, the trapped electrons remain localized within a drain charge storage region that is close to the drain region. For example, a charge can be stored in a drain bit charge storage region 16b of memory cell 10b. The bit line 26b operates as the source region and bit line 26c operates as the drain region. A high voltage may be applied to the channel region 20b and the drain region 26c while the source region 26b is grounded.

Similarly, a source-to-drain bias may be applied along with a high positive voltage on the control gate to inject hot electrons into a source charge storage region that is close to the source region. For example, grounding the drain region 26c in the presence of a high voltage on the gate 20b and the source region 26b may be used to inject electrons into the source bit charge storage region 14b.

As such, the SONOS device can be used to store two bits of data, one in each of the source charge storage region 14 (referred to as the source bit) and the charge storage region 16 (referred to as the drain bit).

Due to the fact that the charge stored in the storage region 14 only increases the threshold voltage in the portion of the channel region 12 beneath the storage region 14 and the charge stored in the storage region 16 only increases the threshold voltage in the portion of the channel region 16 beneath the storage region 16, each of the source bit and the drain bit can be read independently by detecting channel inversion in the region of the channel region 12 between each of the storage region 14 and the storage region 16. To "read" the drain bit, the drain region is grounded while a voltage is applied to the source region and a slightly higher voltage is applied to the gate 20. As such, the portion of the channel region 12 near the source/channel junction will not invert (because the gate 20 voltage with respect to the source region voltage is insufficient to invert the channel) and current flow at the drain/channel junction can be used to detect the change in threshold voltage caused by the programmed state of the drain bit.

Similarly, to "read" the source bit, the source region is grounded while a voltage is applied to the drain region and a slightly higher voltage is applied to the gate 20. As such, the portion of the channel region 12 near the drain/channel junction will not invert and current flow at the source/channel junction can be used to detect the change in threshold voltage caused by the programmed state of the source bit.

In a typical flash memory array, the structure wherein each of multiple cells shares a common word line with adjacent cells creates a problem in reading each cell. For example, when reading bit 14b, the bit line 26b is grounded while a voltage is applied to bit line 26c and to the gate 20b. Current flow at the bit line 26c (representing electrons pulled from the grounded bit line 26b through the channel region 12b) is used to detect threshold voltage of the cell 10b to determine the programmed state of the source bit 14b.

A problem is that because the gate 20b is coupled by the same wordline as gates 20c –20f, the gate 20c is also biased high. As such, a transient current may also flow into the bit line 26c through the cell 20c thereby causing a false read of the bit 14b. To prevent such a current flow, a pre-charge bias is typically applied to the bit line 26d. However, when gate is biased high, even a small difference in voltage between the bit line 26c and the bit line 26d can cause a current flow and a false read.

What is needed is an improved method for reading a dual bit dielectric memory cell that does not suffer the disadvantages of the known methodologies.

SUMMARY OF THE INVENTION

A first aspect of the present invention is to provide a method of detecting a charge stored on a source charge storage region of a first dual bit dielectric memory cell within an array of dual bit dielectric memory cells. The method comprises grounding a first bit line that forms a source junction with a channel region of the first memory cell. The channel region is to the right of first bit line. A high voltage is applied to a second bit line that forms a drain junction with the channel region and is positioned to the right of the channel region and separated from the first bit line only by the channel region. A high voltage is applied to a gate of the first memory cell. A third bit line, that is the next bit line to the right of the second bit line, is isolated such that its potential is effected only by its junctions with the a second channel region and a third channel region on opposing sides of the third bit line. A high voltage is applied to a pre-charge bit line that is to the right of the third bit line and current flow is detected at the second bit line.

In a first embodiment, the pre-charge bit line may be a fourth bit line that is the next bit line to the right of the third bit line and separated from the third bit line only by the third channel region.

The method may also comprise applying a high voltage to a second pre-charge bit line, the second pre-charge bit line being a fifth bit line that is the next bit line to the right of the fourth bit line and separated from the fourth bit line only by the fourth channel region.

In a second embodiment, the pre-charge bit line may be a fifth bit line. The method may comprise isolating a fourth bit line, that is the next bit line to the right of the third bit line, such that its potential is effected only by its junctions with the third channel region and a fourth channel region on opposing sides of the fourth bit line. The fifth bit line may be the next bit line to the right of the fourth bit line and separated from the fourth bit line only by the fourth channel region.

In this embodiment, the method may further comprise applying a high voltage to a second pre-charge bit line, the second pre-charge bit line being a sixth bit line that is the next bit line to the right of the fifth bit line.

A second aspect of the present invention is also to provide a method of detecting a charge stored in a charge storage region adjacent to a first bit line within an array of dual bit dielectric memory cells. The method comprises applying a positive voltage bias to a second bit line with respect to the first bit line. The second bit line is separated from the first bit line only by a first channel region that is positioned beneath the charge storage region. A positive voltage bias is applied to a word line with respect to the first bit line. The word line is positioned over the first channel region. A neutral voltage bias is applied to a pre-charge bit line with respect to the second bit line. The pre-charge bit line may separated from the second bit line by: i) a second channel region that is adjacent to the second bit line; ii) a third bit line that is adjacent to the second channel region; and iii) a third channel region that is adjacent to the third bit line. The third bit line may be isolated such that its potential is affected only by its junctions with each of the second channel region and the third channel region. Current flow is detected at the second bit line to determine the programmed state of the charge storage region.

The method may further comprise applying a neutral voltage bias to a second pre-charge bit line with respect to the second bit line. The second pre-charge bit line may be separated from the second bit line by: i) the second channel region that is adjacent to the second bit line; ii) the third bit line that is adjacent to the second channel region; iii) the third channel region that is adjacent to the third bit line; iv) the pre-charge bit line; and v) a fourth channel region that is adjacent to the pre-charge bit line.

In an alternative embodiment of the second aspect of the present invention, the pre-charge bit line may be separated from the second bit line by: i) a second channel region that is adjacent to the second bit line; ii) a third bit line that is adjacent to the second channel region; iii) a third channel region that is adjacent to the third bit line; iv) a fourth bit line that is adjacent to the third channel region, and v) a fourth channel region that is adjacent to the fourth bit line. In such embodiment, the method may further comprise isolating the fourth bit line such that its potential is effected only by its junctions with each of the third channel region and the fourth channel region.

The alternative embodiment method may further comprise applying a neutral voltage bias to a second pre-charge bit line with respect to the second bit line. The second pre-charge bit line may be separated from the second bit line by: i) the second channel region that is adjacent to the second bit line; ii) the third bit line that is adjacent to the second channel region; iii) the third channel region that is adjacent to the third bit line; iv) the fourth bit line that is adjacent to the third channel region; v) the fourth channel region that is adjacent to the fourth bit line; vi) the pre-charge bit line; and vii) a fifth channel region that is adjacent to the pre-charge bit line.

A third aspect of the present invention is to provide an array of dual bit dielectric memory cells. The array comprises a first bit line and a second bit line, positioned to the right of the first bit line, each of a first conductivity semiconductor. A first channel region of an opposite conductivity semiconductor is positioned between the first bit line and the second bit line—and forms a junction with each of the first bit line and the second bit line. A charge storage layer is positioned above the first channel region and separated from the first channel region by a first insulating barrier. A gate is positioned over the charge storage layer and separated from the charge storage layer by a second insulating barrier. A second channel region of the first conductivity semiconductor is positioned to the right of the second bit line and forms a junction with the second bit line, a third bit line of the first conductivity semiconductor is positioned to the right of the second channel region and forms a junction with the second channel region, a third channel region of the opposite conductivity semiconductor is positioned to the right of the third bit line and forms a junction with the third bit line, and a pre-charge bit line of the first conductivity semiconductor is positioned to the right of the third channel region. A word line control circuit operates to couple a high voltage to the gate and a bit line control circuit operates to: i) coupling the first bit line to ground; ii) couple a high voltage to the second bit line; iii) isolating the third bit line such that its potential is effected only by its junctions with the second channel region and the third channel region; and iv) couple a high voltage to the pre-charge bit line. A current sensor circuit detects state of a charge stored in the charge storage layer by detecting current flow at the second bit line.

In a first embodiment of the third aspect of the present invention, the pre-charge bit line may be a fourth bit line that forms a junction with the third channel region and is separated from the third bit line only by the third channel region. Consistent with the first embodiment, the array may further comprise: i) a fourth channel region of the opposite conductivity semiconductor and positioned to the right of the fourth bit line and forming a junction with the fourth bit line; and ii) a second pre-charge bit line of the first conductivity semiconductor, the second pre-charge bit line being a fifth bit line that is to the right of the fourth channel region and forms a junction with the fourth channel region. The bit line control circuit may further provide for applying a high voltage to the second pre-charge bit line.

In a second embodiment of the third aspect of the present invention, the array may further comprise: i) a fourth bit line of the first conductivity semiconductor and positioned to the right of the third channel region and forms a junction with the third channel region; and ii) a fourth channel region of the opposite conductivity semiconductor and positioned to the right of the fourth bit line and forms a junction with the fourth bit line. The pre-charge bit line is a fifth bit line that is the right the forth bit line and separated from the fourth bit line only by the fourth channel region. And, the bit line control circuit may further provides for isolating the fourth bit line such that its potential is effected only by its junctions with the third channel region and the fourth channel region.

Further yet, the array may comprise: i) a fifth channel region of the opposite conductivity semiconductor and positioned to the right of the fifth bit line and forms a junction with the fifth bit line; and ii) a second pre-charge bit line of the first conductivity semiconductor and being a sixth bit line that is positioned to the right of the fifth channel region and forms a junction with the fifth channel region. The bit line control circuit may further provide for applying a high voltage to the second pre-charge bit line.

In a third embodiment of the fifth aspect of the present invention, a voltage control circuit may provide for: i) applying a positive voltage bias to the second bit line with respect to the first bit line; ii) applying a positive voltage bias to the word line with respect to the first bit line; iii) applying a neutral voltage bias to the pre-charge bit line with respect to the second bit line; and iv) isolating the third bit line such that its potential is effected only by its junctions with each of the second channel region and the third channel region.

For a better understanding of the present invention, together with other and further aspects thereof, reference is made to the following description, taken in conjunction with the accompanying drawings, and its scope will be pointed out in the appended clams.

DESCRIPTION OF THE PREFERRED EMBODIMENTS

Figure 1:
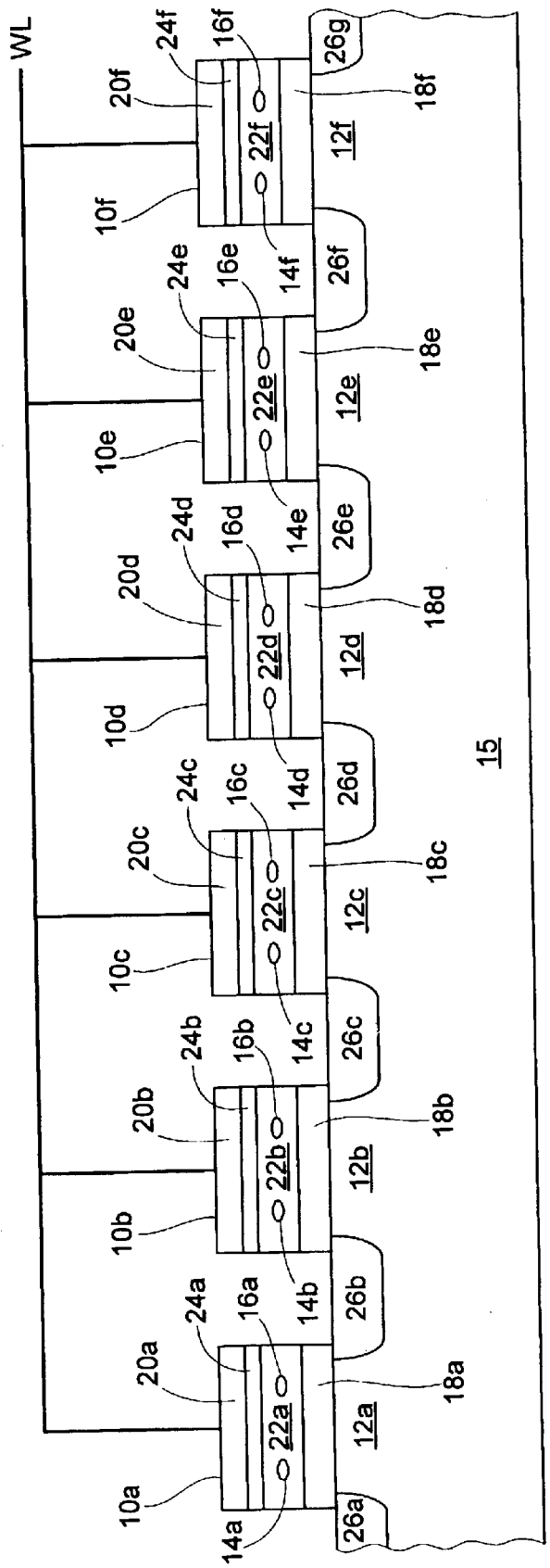
FIG. 1 is a schematic, cross sectional view of a dielectric memory cell array known in the prior art.

The present invention will now be described in detail with reference to the drawings. In the drawings, like reference numerals are used to refer to like elements throughout. Further, the diagrams are not drawn to scale and the dimensions of some features are intentionally drawn larger than scale for purposes of showing clarity.

Figure 2:
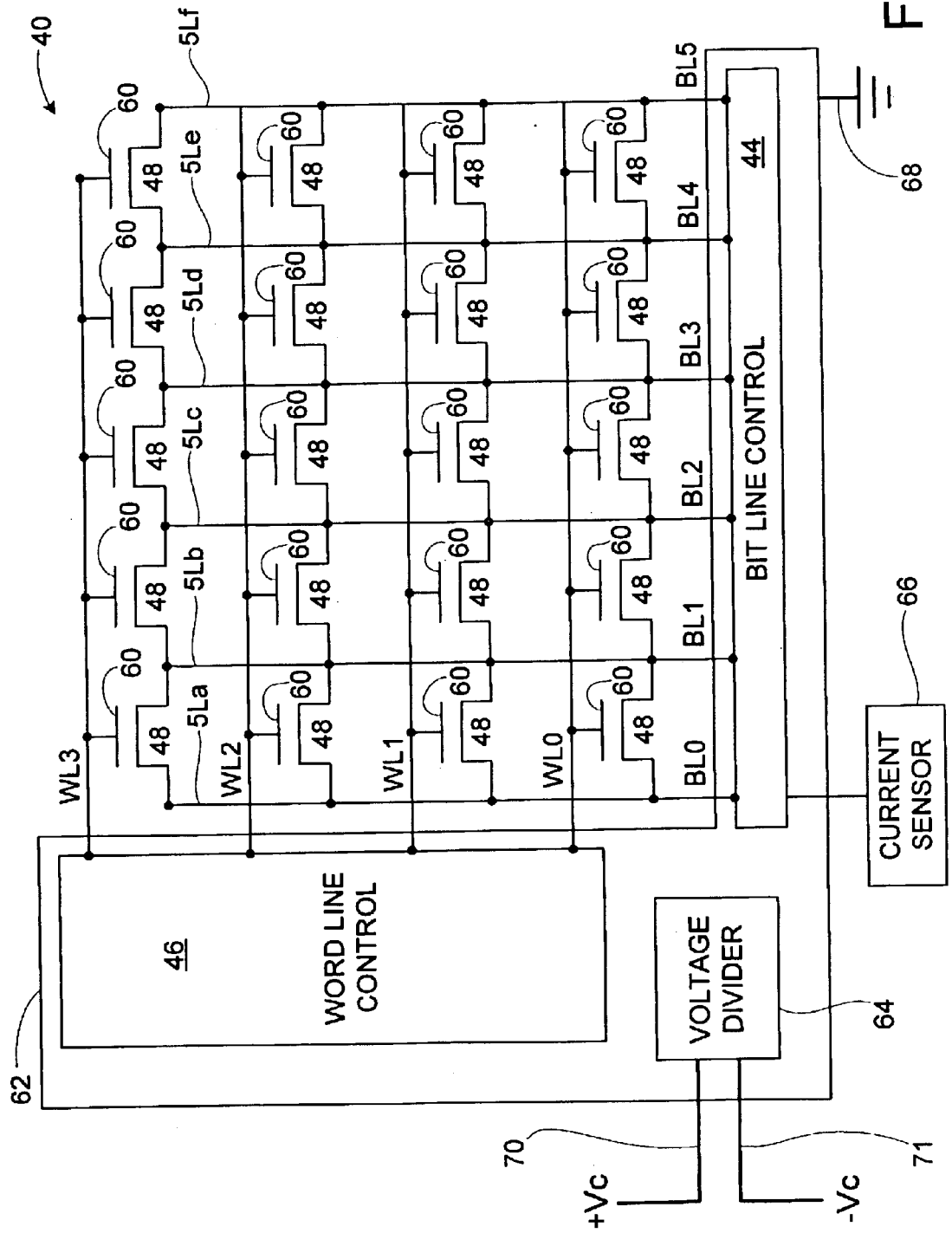
FIG. 2 is a schematic, block diagram view of a dielectric memory cell array in accordance with one embodiment of the present invention.

FIG. 2 shows an exemplary embodiment of a dual bit dielectric memory cell array 40 in block diagram form. The array 40 comprises a plurality of dual bit dielectric memory cells 48, an array control circuit 62, and a current sense circuit 66 fabricated on a crystalline semiconductor substrate. The array of dual bit dielectric memory cells 48 is arranged in a matrix format with horizontal rows of polysilicon word lines WL(0)–WL(3) and vertical bit line diffusions BL(0)–BL(5) alternating with columns of channel regions 50 within the substrate 42. Each cell 48 within a row shares the same word line 72 with other cells 48 in the row. Each column of channel regions 50 comprises a cell channel region 50 beneath the columns intersection with a word line WL(0)–WL(3). Each cell 48 within a column shares the two bit lines that are adjacent to the channel regions 50 of each cell 48 within the column.

Figure 3:
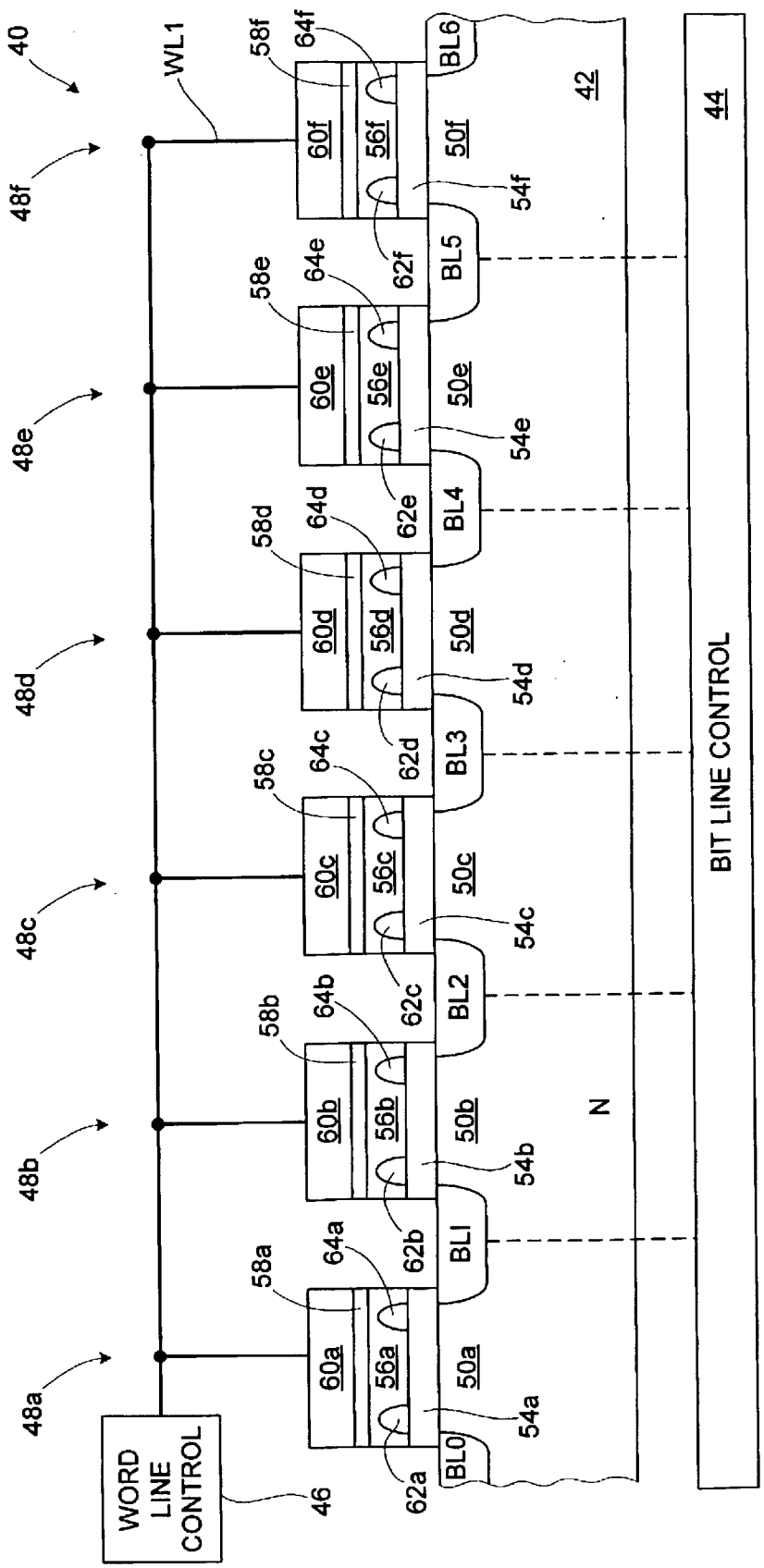
FIG. 3 is a schematic, cross sectional view of the dielectric memory cell array of FIG. 2.

Reference is now made to the cross section diagram of a row of dual bit dielectric memory cells which share a common word line WL(1) as shown in FIG. 3 in conjunction with the FIG. 2. It should be appreciated that the polysilicon word line WL(1) is structured to form a control gate 60 over each cell 48 in the row. The bit line diffusions BL(0)–BL(6) are of opposite semi conductive conductivity as the channel regions 50 such that the bit line diffusions BL(0)–BL(6) form a source region and a drain region for each cell in the column. In the exemplary n-mos device, the channel region 50 is an p-type semiconductor such as crystalline silicon lightly implanted with an hole donor impurity such as boron and the bit line diffusion BL(0)–BL(6) is a n-type semiconductor such as crystalline silicon implanted with a electron donor impurity such as arsenic.

Above the channel region 50 is a first insulating barrier or tunnel layer 54 which ay comprise silicon dioxide. The thickness of the tunnel layer 54 may be within a range of about 40 to about 150 angstroms. An embodiment with a more narrow bracket includes a tunnel layer 54 thickness within a range of about 60 to about 90 angstroms and even narrower yet, a tunnel layer 54 with a thickness of about 70 to about 80 angstroms.

Above the tunnel layer is a charge trapping layer 56 that includes both a source charge trapping region or source, bit 62 and a drain charge trapping region or drain bit 64 each for storing a neutral charge representing an un-programmed state or a negative charge representing a programmed state. The charge trapping layer 56 may, comprise a nitride compound with suitable charge trapping properties and may have a thickness on the order of 20 to 100 angstroms. In the exemplary embodiment, the nitride compound may be selected from the group consisting of $Si_2N_4$, $Si_3N_4$ and $SiO_xN_4$.

Above the charge trapping layer 56 is a top dielectric layer 58. The top dielectric layer 58 may be silicon dioxide or may be a material with a dielectric constant greater than the dielectric constant than silicon dioxide (e.g. a high K material). In a preferred embodiment, the high K material may be selected from the group of materials consisting of $Al_2O_3$, $HfSi_xO_y$, $HfO_2$, $ZrO_2$, and $ZrXi_xO_y$ and other materials with similarly high dielectric constants. If the top dielectric layer 58 is silicon dioxide, the layer 58 may have a thickness on the order of 60 to 100 angstroms. Alternatively, if the top dielectric layer 58 is a high K material, its electrical thickness may be on the order of 60 to 100 angstroms while its physical thickness may be within a range of about 70 to 130 angstroms. An embodiment with a more narrow bracket includes a top dielectric layer 58 with a thickness within a range of about 80 to about 120 angstroms and even narrower yet, a top dielectric layer 58 with a thickness of about 90 to about 100 angstroms.

Above the top dielectric layer 58 is the word-line WL1 forming the gate 60 over each cell 48a–48f. In the exemplary embodiment, the gate 60 may comprises polysilicon with a thickness on the order of 4,000 angstroms. The word-line WL1 is coupled to the wordline control circuits 46.

The array control circuit comprises a word line control circuit 46, a bit line control circuit 44, a voltage divider circuit 64, a coupling to an operating power source (Vcc) 70 and a coupling to a ground 68. In operation, the array control circuit operates to selectively couple each word line 72 and each bit line 52 to a voltage provided by the voltage divider 64 or to ground (or to isolate the word line 72 or bit line 52 from all voltage sources and ground such that is potential is effected only by electrical interaction with other structure of the array 40). The coupling is in such a manner that each source charge trapping region 62 and each drain charge trapping region 64 within the array 40 can be erased, selectively programmed, and selectively read. The array control circuit also operate to couple a selected bit line to the current sensor 66 such that a current on the selected bit line may be measured to indicate the programmed state of a selected source charge trapping region 62 or drain charge trapping region 64 of a cell within a column of cells in which such selected bit line is either a source or a drain.

The current sensor 66 may utilize known circuits for sensing current on the selected bit line that is coupled to the current sensor 66 by the bit line control circuit 44. The current sensed represents the programmed state of a selected one of a source charge trapping region 62 or a drain charge trapping region 64 when applicable potentials are coupled to applicable word lines and bit lines by the array control circuit 62 for reading the selected charge trapping region as described in more detail herein.

Array Control Circuit

Figures 4A, 4B:
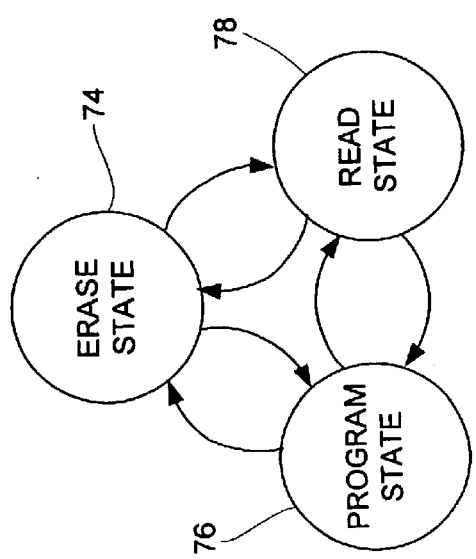
FIG. 4a is a state machine diagram representing exemplary operation of an array control circuit.
FIG. 4b is a table representing exemplary operating embodiments of an array control circuit in accordance with this invention.

Turning briefly to FIG. 4a in conjunction with FIG. 2 and FIG. 3, the array control circuit 62 operates in three states, a program state 76 where in charge is selectively stored into the source charge trapping region 62 or the drain charge trapping region 64 of a selected one of the memory cells 48, a read state 78 wherein a stored charge is detected from the source charge trapping region 62 or the drain charge trapping region 62 of a selected one of the memory cells 48 to reproduce data originally stored in such charge trapping region, and an erase state 78 wherein charge stored in charge trapping regions 62 and 64 of one or more memory cells 48 is removed prior to reprogramming in the program state 76.

When in the program state 76, the source charge trapping region 62 is programmed by injecting electrons into the source charge trapping region 62 using a hot electron injection technique. More specifically, the array control circuit 62 couples bit lines BL(0)–BL(6) and word lines WL(0)–WL(3) to various potentials (e.g provided by the voltage divider 64 and ground 68) to apply a high source-to-drain bias while applying a high voltage to the control gate 60. For example, referring to cell 48b, this may be accomplished by the bit line control circuit 44 coupling the bit line BL(2), which represents the drain region of cell 48b, to ground 68 and coupling the bit line BL(1), which represents the source region of cell 48b, to a voltage source from the voltage divider 64 of approximately 5 volts. Simultaneously, word line control circuit 46 couples the word line WL(1), representing the control gate 60, to a voltage source form the voltage divider 64 of approximately 10 volts. The voltage on the control gate 60 inverts the channel region 50b while the high source-to-drain bias draws and accelerates electrons from the drain region BL(2) into the channel region 50b towards the source region BL(1).

The 4.5 eV to 5 eV kinetic energy gain of the electrons is more than sufficient to surmount the 3.1 eV to 3.5 eV energy barrier at channel region 50b/tunnel layer 54b interface and, while the electrons are accelerated towards source region BL(1), the field caused by the high voltage on control gate 60b redirects the electrons towards the source charge trapping region 62b. Those electrons that cross the interface into the source charge trapping region 62b remain trapped within the charge trapping layer 56b for later reading.

Similarly, the drain charge trapping region 64 is programmed by injecting electrons into the drain charge trapping region 64 using a hot electron injection technique. More specifically, the array control circuit 62 couples bit lines BL(0)–BL(6) and word lines WL(0)–WL(3) to various potentials (e.g provided by the voltage divider 64 and ground 68) to apply a high drain-to-source bias while applying a high voltage to the control gate 60. For example, referring to cell 48b, this may be accomplished by the bit line control circuit 44 coupling the bit line BL(1), which represents the source region of cell 48b, to ground 68 and the bit line control circuit 44 coupling the bit line BL(2), which represents the drain region of cell 48b, to a voltage source from the voltage divider 64 of approximately 5 volts. Simultaneously, the word line control circuit 46 couples the word line WL(1), representing the control gate 60, to a voltage source form the voltage divider 64 of approximately 10 volts. The voltage on the control gate 60 inverts the channel region 50b while the high drain-to-source bias draws and accelerates electrons from the source region BL(1) into the channel region 50b towards the drain region BL(2).

Again, the 4.5 eV to 5 eV kinetic energy gain of the electrons is more than sufficient to surmount the 3.1 eV to 3.5 eV energy barrier at channel region 52b/tunnel layer 54b interface and, while the electrons are accelerated towards drain region 52c, the field caused by the high voltage on control gate 60b redirects the electrons towards the drain charge trapping region 64b.

When in the erase state 74, the array control circuit may couple applicable bit lines BL(0)–BL(6) and word lines 72 to applicable potentials such that the source charge trapping region 62 and the drain charge trapping region 64 of multiple cells are erased using either a hot hole injection technique or by tunneling the electrons from the charge trapping layer 56 to the gate 60 or the substrate. Both techniques are known in the art.

When in the read state 78, the presence of trapped electrons (e.g a negative charge representing a programmed state) in a selected source charge trapping region 62 or drain charge trapping region 64 are detected. It is recognized that the presence of trapped electrons within a source charge trapping region 62 or a drain charge trapping region 64 effect accumulation within the channel region 50 below such charge trapping regions. As such, the presence of trapped electrons in either the source charge trapping region 62 or the drain charge trapping region 64 effect the threshold voltage of a field effect transistor (FET) characterized by the control gate 60, a bit line diffusion BL(0)–BL(6) that functions as a source region, and a bit line diffusion BL(0)–BL(6) that functions as a drain region. Therefore, each bit of the dual bit memory cell 48 may be "read", or more specifically, the presence of electrons stored within each of the source charge trapping region 62 and the drain charge trapping region 64 may be detected by operation of the FET.

In particular, the presence of electrons stored within a source charge trapping region 62 may be detected by applying a positive voltage to the control gate 60 and a lesser positive voltage to the bit line that functions as the drain region while the bit line that functions as the source region is grounded. The current flow is then measured at the bit line that functions as either the source or the drain region. Assuming proper voltages and thresholds for measurement (and assuming no current leakage from adjacent memory cells 48 within the same row as the selected cell 48 and assuming no current leakage form memory cells 48 within the same column as the selected cell 48, if there are electrons trapped within the source charge trapping region 62, no measurable current will be measured at the bit line comprising the drain region. Otherwise, if the source charge trapping region 62 is charge neutral (e.g., no trapped electrons) then there will be a measurable current flow into bit line functioning as the drain region. Similarly, the presence of electrons stored within the drain charge trapping region 64 may be detected by the same method, and merely reversing the bit line functioning as the source region and the bit line functioning as the drain region.

Recognizing that current leakage from adjacent memory cells in the same row as the selected cell may affect accurate reading. The table of FIG. 4b represents four exemplary embodiments 80, 82, 84, and 86 of operation of the array control circuit 62 for reading the source charge trapping region 62 in the presence of possible current leakage from adjacent cells 48. The same embodiments may be utilized for reading a drain charge trapping region 64 by reversing the potential applied to each of the bit lines representing the source region land the drain region in accordance with the teachings above.

Referring to the table of FIG. 4b in conjunction with FIG. 3, exemplary embodiment 80 comprises the word line control circuit 46 coupling the word line 72 associated with the cell 48 to be read to a gate voltage source on the order of 10 volts from the voltage divider 64 while coupling adjacent word lines to ground 68. The bit line control circuit 44 couples the bit line that comprises the source region of the cell 48 to be read to ground 68. The bit line control circuit 44 further couples the bit line 52 that comprises the drain region of the cell 48 to be read to a high voltage source form the voltage divider 64 that is a positive voltage greater than ground and less than or equal to the gate voltage (e.g. the drain bit line has a neutral bias to the gate voltage and a positive bias to the source bit line while the gate has a positive bias to the source bit line).

For example, if the source bit 62b is to be read, the bit line control circuit couples the bit line BL(1) to ground 68 and bit line BL(2) to the high voltage. For clarity in the table of FIG. 4b, the bit line 52,representing the source is referred to as BL(1) while the bit line 52 representing the drain (e.g. the next bit line to the right of the source bit line in FIG. 3) is referred to as BL(2).

The bit line control circuit 44 isolates the next bit line to the right of the drain bit line, referred to as BL(3), such that its potential may float while being effected only by its junctions with each of the channel regions 50 on opposing sides of the bit line (e.g channel regions 50c and 50d in the example of reading source bit 62b).

The bit line control circuit couples the next bit line to the right of BL(3), referred to as BL(4), to the high voltage source such that it is neutral biased to the control gate 60 and positive biased with respect to the source bit line BL(1). Because BL(3) is coupled to the high voltage source, it may be referred to as a pre-charged bit line.

The exemplary embodiment 82 comprises the word line control circuit 46 coupling the word line 72 associated with the cell 48 to be read to the gate voltage source from the voltage divider 64 while coupling adjacent word lines 72 to ground 68. The bit line control circuit 44 couples the bit line 52 that comprises the source region of the cell 48 (e.g. BL(1)) to ground 68 and couples the bit line that comprises the drain region of the cell 48 (e.g. BL(2) to the high voltage source form the voltage divider 64.

The bit line control circuit 44 isolates the next bit line to the right of the drain bit line (e.g. isolates the bit line BL(3) in the table of FIG. 4b) such that its potential may float while being effected only by its junctions with each of the channel regions 50 on opposing sides of the bit line BL(3).

The bit line control circuit 414 couples the next two bit lines (e.g. BL(4) and BL(5)) to the right of floating bit line BL(3) to the high voltage source such that both of these pre-charged bit lines are neutral biased to the control gate 60 and positive biased with respect to the source bit line BL(1).

The exemplary embodiment 84 comprises the word line control circuit 46 coupling the word line 72 associated with the cell 48 to be read to the gate voltage source from the voltage divider 64 while coupling adjacent word lines 72 to ground 68. The bit line control circuit 44 couples the bit line 52 that comprises the source region of the cell 48 (e.g. BL(1)) to ground 68 and couples the bit line that comprises the drain region of the cell 48 (e.g. BL(2) to the high voltage source form the voltage divider 74.

The bit line control circuit 44 isolates the next two bit lines to the right of the drain bit line (e.g. isolates the bit lines BL(3) and BL(4) in the table of FIG. 4b) such that the potential of each may float while being effected only by its junctions with each of the channel regions 50 on opposing sides.

The bit line control circuit couples the next bit line (e.g. BL(5)) to the right of the two floating bit lines BL(3) and BL(4) to the high voltage source such that this pre-charged bit line is neutral bias to the control gate 60 and biased high with respect to the source bit line BL(1).

The exemplary embodiment 86 comprises the word line control circuit 46 coupling the word line 72 associated with the cell 48 to be read to the gate voltage source from the voltage divider 74 while coupling adjacent word lines to ground. The bit line control circuit 44 couples the bit line 52 that comprises the source region of the cell 48 (e.g. BL(1)) to ground and couples the bit line that comprises the drain region of the cell 48 (e.g. BL(2) to the high voltage source form the voltage divider 74.

The bit line control circuit 44 isolates the next two bit lines to the right of the drain bit line (e.g. isolates the bit lines BL(3) and BL(4) in the table of FIG. 4b) such that the potential of each may float while being effected only by its junctions with each of the channel regions 50 on opposing sides.

The bit line control circuit couples the next two bit lines (e.g. BL(5) and BL(6)) to the right of floating bit lines BL(3) and BL(4) to the high voltage source such that both of these pre-charged bit lines are neutral bias to the control gate 60 and biased high with respect to the source bit line BL(1).

The exemplary embodiment 87 comprises the word line control circuit 46 coupling the word line 72 associated with the cell 48 to be read to the gate voltage source from the voltage divider 64 while coupling adjacent word lines 72 to ground 68. The bit line control circuit 44 couples the bit line 52 that comprises the source region of the cell 48 (e.g. BL(1)) to ground 68 and couples the bit line that comprises the drain region of the cell 48 (e.g. BL(2) to the high voltage source form the voltage divider 74.

The bit line control circuit 44 isolates the next block of n bit lines (e.g. bit lines BL(3) through BL(n)) to the right of the drain bit line such that the potential of each may float while being effected only by its junctions with each of the channel regions 50 on opposing sides.

The bit line control circuit couples the next bit line (e.g. BL(n+1)) to the right of the floating bit lines, BL(3) through BL(n), to the high voltage source such that this pre-charged bit line is neutral bias to the control gate 60 and biased high with respect to the source bit line BL(1).

The exemplary embodiment 89 comprises the word line control circuit 46 coupling the word line 72 associated with the cell 48 to be read to the gate voltage source from the voltage divider 74 while coupling adjacent word lines to ground. The bit line control circuit 44 couples the bit line 52 that comprises the source region of the cell 48 (e.g. BL(1)) to ground and couples the bit line that comprises the drain region of the cell 48 (e.g. BL(2) to the high voltage source form the voltage divider 74.

The bit line control circuit 44 isolates the next block of n bit lines (e.g. bit lines BL(3) through BL(n)) to the right of the drain bit line such that the potential of each may float while being effected only by its junctions with each of the channel regions 50 on opposing sides.

The bit line control circuit couples the next group of bit lines (e.g. BL(n+1) through BL(n+x)) to the right of floating bit lines, BL(3) through BL(n) to the high voltage source such that this block of pre-charged bit lines are neutral bias to the control gate 60 and biased high with respect to the source bit line BL(1).

In summary, the method for reading data from a dual bit dielectric memory cell of this invention provides for more accurate reading in view of potential current leakage from adjacent cells. Although this invention has been shown and described with respect to certain preferred embodiments, it is obvious that equivalents and modifications will occur to others skilled in the art upon the reading and understanding of the specification. For example, Although the cells of the array are shown as a substantially planar structure formed on the silicon substrate, it should be appreciated that the teachings of this invention may be applied to both planar, fin formed, and other dielectric memory cell structures which may be formed on suitable semiconductor substrates which include, for example, bulk silicon semiconductor substrates, silicon-on-insulator (SOI) semiconductor substrates, silicon-on-sapphire (SOS) semiconductor substrates, and semiconductor substrates formed of other materials known in the art. The present invention includes all such equivalents and modifications, and is limited only by the scope of the following claims.

What is claimed is:

1. A method of detecting a charge stored on a source charge storage region of a first dual bit dielectric memory cell within an array of dual bit dielectric memory cells, the method comprising:
   grounding a first bit line that forms a source junction with a channel region of the first memory cell, the channel region being to the right of the first bit line;
   applying a high voltage to a gate of the first memory cell;
   applying a high voltage toga second bit line that forms a drain junction with the channel region, the second bit line positioned to the right of the first bit line and to the right of the channel region;
   isolating a third bit line such that its potential is effected only by its junctions with a second channel region and a third channel region;
      the third bit line being to the right of the second bit line and separated from the second bit line only by the second channel region that is positioned there between;
      the third channel region being positioned to the right of the third bit line;
   applying a high voltage to a pre-charge bit line, the pre-charge bit line being to the right of the third bit line; and
   detecting current flow at the second bit line.

2. The method of claim 1, wherein the pre-charge bit line is a fourth bit line that is the next bit line to the right of the third bit line and separated from the third bit line only by the third channel region that is positioned there between.

3. The method of claim 2, further comprising applying a high voltage to a second pre-charge bit line, the second pre-charge bit line being a fifth bit line that is the next bit line to the right of the fourth bit line and separated from the fourth bit line only by a fourth channel region positioned there between.

4. The method of claim 1, further comprising
   isolating a fourth bit line, that is the next bit line to the right of the third bit line, such that its potential is effected only by its junctions with the third channel region and a fourth channel region on opposing sides of the fourth bit line; and
   wherein the pre-charge bit line is a fifth bit line that is the next bit line to the right of the fourth bit line and separated from the fourth bit line only by the fourth channel region positioned there between.

5. The method of claim 4, further comprising a high voltage to a second pre-charge bit line, the second pre-charge bit line being a sixth bit line that is the next bit line to the right of the fifth bit line and separated from the fifth bit line only by a fifth channel region positioned there between.

6. A method of detecting a charge stored in a charge storage region adjacent to a first bit line within an array of dual bit dielectric memory cells, the method comprising:
   applying a positive voltage bias to a second bit line with respect to the first bit line, the second bit line being separated from the first bit line only by a first channel region that is positioned beneath the charge storage region;

applying a positive voltage bias to a word line with respect to the first bit line, the word line positioned over the first channel region;

applying a neutral voltage bias to a pre-charge bit line with respect to the second bit line, the pre-charge bit line being separated from the second bit line by:
 a second channel region that is adjacent to the second bit line;
 a third bit line that is adjacent to the second channel region; and
 a third channel region that is adjacent to the third bit line;

isolating the third bit line such that its potential is effected only by its junctions with each of the second channel region and the third channel region; and detecting current flow at the second bit line.

7. The method of claim 6, further comprising:
applying a neutral voltage bias to a second pre-charge bit line with respect to the second bit line, the second pre-charge bit line being separated from the second bit line by:
 the second channel region that is adjacent to the second bit line;
 the third bit line that is adjacent to the second channel region;
 the third channel region that is adjacent to the third bit line;
 the pre-charge bit line; and
 a fourth channel region that is adjacent to the pre-charge bit line.

8. A method of detecting a charge stored in a charge storage region adjacent to a first bit line within an array of dual bit dielectric memory cells, the method comprising:

applying a positive voltage bias to a second bit line with respect to the first bit line, the second bit line being separated from the first bit line only by a first channel region positioned beneath the charge storage region;

applying a positive voltage bias to a word line with respect to the first bit line, the word line being positioned over the first channel region;

applying a neutral voltage bias to a pre-charge bit line with respect to the second bit line, the pre-charge bit line being separated from the second bit line by:
 a second channel region that is adjacent to the second bit line;
 a third bit line that is adjacent to the second channel region;
 a third channel region that is adjacent to the third bit line;
 a fourth bit line that is adjacent to the third channel region; and
 a fourth channel region that is adjacent to the fourth bit line;

isolating the third bit line such that its potential is effected only by its junctions with each of the second channel region and the third channel region;

isolating the fourth bit line such that its potential is effected only by its junctions with each of the third channel region and the fourth channel region; and detecting current flow at the second bit line.

9. The method of claim 8, further comprising:
applying a neutral voltage bias to a second pre-charge bit line with respect to the second bit line, the second pre-charge bit line being separated from the second bit line by:
 the second channel region that is adjacent to the second bit line;
 the third bit line that is adjacent to the second channel region;
 the third channel region that is adjacent to the third bit line;
 the fourth bit line that is adjacent to the third channel region;
 the fourth channel region that is adjacent to the fourth bit line;
 the pre-charge bit line; and
 a fifth channel region that is adjacent to the pre-charge bit line.

10. An array of dual bit dielectric memory cells, the array comprising:
 a first bit line of a first conductivity semiconductor;
 a first channel region of an opposite conductivity semiconductor forming a junction with the first bit line;
 a charge storage layer positioned above the first channel region and separated from the first channel region by a first insulating barrier;
 a word line forming a gate positioned over the charge storage layer and separated from the charge storage layer by a second insulating barrier;
 a second bit line of the first conductivity semiconductor positioned to the right of the channel region and forming a junction with the channel region;
 a second channel region of the first conductivity semiconductor and positioned to the right of the second bit line and forming a junction with the second bit line;
 a third bit line of the first conductivity semiconductor and positioned to the right of the second channel region and forming a junction with the second channel region;
 a third channel region of the opposite conductivity semiconductor and positioned to the right of the third bit line and forming a junction with the third bit line;
 a pre-charge bit line of the first conductivity semiconductor and positioned to the right of the third channel region;
 a word line control circuit for applying a high voltage to the gate;
 a bit line control circuit for:
  coupling the first bit line to ground;
  applying a high voltage to the second bit line;
  isolating the third bit line such that its potential is effected only by its junctions with the second channel region and the third channel region;
  applying a high voltage to the pre-charge bit line; and
 a current sensor circuit for detecting the state of a charge stored in the charge storage layer by detecting current flow at the second bit line.

11. The array of memory cells of claim 10, wherein the pre-charge bit line is a fourth bit line that forms a junction with the third channel region and is separated from the third bit line only by the third channel region.

12. The array of memory cells of claim 11, further comprising:
 a fourth channel region of the opposite conductivity semiconductor and positioned to the right of the fourth bit line and forming a junction with the fourth bit line;
 a second pre-charge bit line of the first conductivity semiconductor, the second pre-charge bit line being a fifth bit line that is to the right of the fourth channel region and forms a junction with the fourth channel region; and wherein the bit line control circuit further provides for applying a high voltage to the second pre-charge bit line.

13. The array of memory cells of claim 10:

further comprising:
a fourth bit line of the first conductivity semiconductor and positioned to the right of the third channel region and forms a junction with the third channel region;
a fourth channel region of the opposite conductivity semiconductor and positioned to the right of the fourth bit line and forms a junction with the fourth bit line;

wherein:
the pre-charge bit line is a fifth bit line that is the right the forth bit line and separated from the fourth bit line only by the fourth channel region;
the bit line control circuit further provides for isolating the fourth bit line such that its potential is effected only by its junctions with the third channel region and the fourth channel region.

14. The array of memory cells of claim 13, further comprising:
a fifth channel region of the opposite conductivity semiconductor and positioned to the right of the fifth bit line and forms a junction with the fifth bit line;
a second pre-charge bit line of the first conductivity semiconductor and being a sixth bit line that is positioned to the right of the fifth channel region and forms a junction with the fifth channel region; and wherein
the bit line control circuit further provides for applying a high voltage to the second pre-charge bit line.

15. An array of dual bit dielectric memory cells, the array comprising:
a first bit line of a first conductivity semiconductor;
a first channel region of an opposite conductivity semiconductor forming a junction with the first bit line;
a charge storage layer positioned above the first channel region and separated from the first channel region by a first insulating barrier;
a word line forming a gate positioned over the charge storage layer and separated from the charge storage layer by a second insulating barrier;
a second bit line of the first conductivity semiconductor and positioned to the right of the channel region and forming a junction with the channel region;
a second channel region;of the opposite conductivity semiconductor and positioned to the right of the second bit line and forming a junction with the second bit line;
a third bit line of the first conductivity semiconductor and positioned to the right of the second channel region and forming a junction with the second channel region;
a third channel region of the opposite conductivity semiconductor and positioned to the right of the third bit line and forming a junction with the third bit line;
a pre-charge bit line of the first conductivity semiconductor and positioned to the right of the third channel region;
a current sensor circuit for detecting the state of a charge stored in the charge storage layer by detecting current flow at the second bit line;

a voltage control circuit for:
applying a positive voltage bias to the second bit line with respect to the first bit line;
applying a positive voltage bias to the word line with respect to the first bit line;
applying a neutral voltage bias to the pre-charge bit line with respect to the second bit line; and
isolating the third bit line such that its potential is effected only by its junctions with each of the second channel region and the third channel region.

16. The array of memory cells of claim 15, wherein:
the pre-charge bit line is a fourth bit line that is positioned to the right of the third channel region and forms a junction with the third channel region.

17. The array of memory cells of claim 16, further comprising:
a fourth channel region of the opposite conductivity semiconductor and positioned to the right of the fourth bit line and forming a junction with the fourth bit line;
a second pre-charge bit line of the opposite conductivity semiconductor, the second pre-charge bit line being a fifth bit line that is positioned to the right of the fourth channel region and forms a junction with the fourth channel region; and wherein
the voltage control circuit for provides for applying a neutral voltage to the second pre-charge bit line with respect to the second bit line.

18. The array of memory cells of claim 15, further comprising:
a fourth bit line of the first conductivity semiconductor and positioned to the right of the third channel region and forming a junction with the third channel region;
a fourth channel region of the opposite conductivity semiconductor and positioned to the right of the fourth bit line and forming a junction with the fourth bit line; and wherein
the voltage control circuit further provides for isolating the fourth bit line such that its potential is affected only by its junctions with the third channel region and the fourth channel region; and
wherein the pre-charge bit line is a fifth bit line that is the right of the fourth channel region and forms a junction with the fourth channel region.

19. The array of memory cells of claim 18, further comprising:
a fifth channel region of the opposite conductivity semiconductor and positioned to the right of the fifth bit line and forming a junction with the fifth bit line;
a second pre-charge bit line of the first conductivity semiconductor, the second pre-charge bit line being a sixth bit line that is positioned to the right of the fifth channel region and forming a junction with the fifth channel region; and wherein
the voltage control circuit further provides for applying a neutral voltage bias to the second pre-charge bit line with respect to the second bit line.

* * * * *

UNITED STATES PATENT AND TRADEMARK OFFICE
CERTIFICATE OF CORRECTION

PATENT NO. : 6,788,583 B2
DATED : September 7, 2004
INVENTOR(S) : He et al.

It is certified that error appears in the above-identified patent and that said Letters Patent is hereby corrected as shown below:

Column 6,
Line 53, replace "ay compromise" with -- may compromise --
Line 61, replace "source, bit" with -- source bit --
Line 65, replace "may, compromise" with -- may compromise --

Column 9,
Line 53, replace "region land the" with -- region and the --

Column 10,
Line 37, replace "414" with -- 44 --

Column 12,
Line 18, replace "toga" with -- to a --

Column 15,
Line 48, replace "region;of" with -- region of --

Signed and Sealed this

Seventh Day of December, 2004

JON W. DUDAS
*Director of the United States Patent and Trademark Office*